US008907671B2

(12) United States Patent
Stamm et al.

(10) Patent No.: US 8,907,671 B2
(45) Date of Patent: Dec. 9, 2014

(54) METHOD AND MRI DEVICE TO DETECT A DIRECTION OF AT LEAST ONE FIBER IN A BODY

(75) Inventors: Aymeric Stamm, Argertre de Plesses (FR); Christian Barillot, Laille (FR); Patrick Perez, Rennes (FR)

(73) Assignees: Universite de Rennes 1, Rennes (FR); Centre National de la Recherche Scientifique (CNRS), Paris (FR); Institut National de Recherche en Informatique et en Automatique, Rocquencourt (FR)

( * ) Notice: Subject to any disclaimer, the term of this patent is extended or adjusted under 35 U.S.C. 154(b) by 371 days.

(21) Appl. No.: 13/299,309

(22) Filed: Nov. 17, 2011

(65) Prior Publication Data

US 2012/0187946 A1    Jul. 26, 2012

Related U.S. Application Data

(60) Provisional application No. 61/417,382, filed on Nov. 26, 2010.

(30) Foreign Application Priority Data

Nov. 24, 2010  (EP) .................................... 10306290

(51) Int. Cl.
  *G01V 3/00*    (2006.01)
  *G01R 33/563*  (2006.01)
(52) U.S. Cl.
  CPC ................... *G01R 33/56341* (2013.01)
  USPC ........................................................... 324/309
(58) Field of Classification Search
  USPC .................................................. 324/300–322
  See application file for complete search history.

(56) References Cited

U.S. PATENT DOCUMENTS

| 5,539,310 | A | 7/1996 | Basser et al. |
| 5,936,405 | A * | 8/1999 | Prammer et al. ............... 324/303 |
| 6,242,912 | B1 * | 6/2001 | Prammer et al. ............... 324/303 |
| 6,512,371 | B2 * | 1/2003 | Prammer ....................... 324/303 |
| 6,526,305 | B1 | 2/2003 | Mori |

(Continued)

OTHER PUBLICATIONS

Angelos Barmpoutis et al., Extracting Tractosemas from a Displacement Probability Field for Tractography in DW-MRI, Medical Image Computing and Computer-Assisted Intervention Â Miccai 2008; [Lecture Notes in Computer Science], Sep. 6, 2008, pp. 9-16, Springer Berlin Heidelberg, Berlin, Heidelberg, Germany.

(Continued)

*Primary Examiner* — Dixomara Vargas
(74) *Attorney, Agent, or Firm* — Blakely Sokoloff Taylor & Zafman

(57) ABSTRACT

Method to extract a diffusion direction from DW-MR signals, in which a magnetic field gradient $q_i$ is applied to a body part, a magnetic resonance signal $S_i$ is measured and a diffusion direction $\mu_j$ is determined, wherein for a predetermined positive number m of diffusion direction(s) $\mu_j$, the signals $S_i$ are linked to the probability density function of the random vector X of water molecules displacements represented as a mixture of m probability density functions $p_{X_j}$ of random vectors $X_j$ characterizing the diffusion along $\mu_j$, the $X_j$ being decomposed into a first component modelling directional variability of the water molecules displacements with $\mu_j$ as mean direction, and into a second component modelling the length variability of the water molecules displacements along $\mu_j$.

10 Claims, 5 Drawing Sheets

(56) References Cited

U.S. PATENT DOCUMENTS

| | | |
|---|---|---|
| 6,956,371 B2 * | 10/2005 | Prammer .................. 324/303 |
| 2005/0007100 A1 | 1/2005 | Basser et al. |
| 2008/0252291 A1 | 10/2008 | Hoogenraad et al. |

OTHER PUBLICATIONS

Yogesh Rathi et al., Directional functions for orientation distribution estimation, Medical Image Analysis, Jun. 1, 2009, pp. 432-444, vol. 13 No. 3, Oxford University Press, Oxford, Great Britain.

Angelos Barmpoutis et al., Information Theoretic Methods for Diffusion-Weighted MRI Analysis, Emerging Trends in Visual Computing, Nov. 18, 2008, pp. 327-346, Springer Berlin Heidelberg, Berlin, Heidelberg, Germany.

Hosey, Tim P., et al., "Application of a Probabilistic Double-Fibre Structure Model to Diffusion-Weighted MR Images of the Human Brain," *Magnetic Resonance Imaging*, vol. 26, No. 2, Elsevier Science, Tarrytown NY, Jan. 29, 2008, pp. 236-245.

McGraw, Tim, et al., "Segmentation of High Angular Resolution Diffusion MRI Modeled as a Field of von Mises-Fisher Mixtures," *Computer Vision—ECCV 2006 Lecture Notes in Computer Science*, LNCS, Springer, Berlin, DE', Jan. 1, 2006, pp. 463-475.

McGraw, Tim, et al., "Von Mises-Fisher Mixture Model of the Diffusion ODF," *Biomedical Imaging: Macro to Nano*, 3rd IEEE International Symposium, Piscataway, NJ, US, Apr. 6, 2006, pp. 65-68.

Bhalerao, Abhir, et al., "Hyperspherical von Mises-Fisher Mixture (HvMF) Modelling of High Angular Resolution Diffusion MRI," *Medical Image Computing and Computer-Assisted Intervention A Miccai 2007 (Lecture Notes in Computer Science)*, Springer, Berlin, Heidelberg, DE, Oct. 29, 2007, pp. 236-243.

Salvador, Raymond, et al., "Formal Characterization and Extension of the Linearized Diffusion Tensor Model," *Human Brain Mapping*, vol. 24, No. 2, Wiley-Liss, New York, NY, US, Feb. 1, 2005, pp. 144-155.

* cited by examiner

METHOD AND MRI DEVICE TO DETECT A DIRECTION OF AT LEAST ONE FIBER IN A BODY

This is a non-provisional application claiming the benefit of U.S. Provisional Application No. 61/417,382, filed Nov. 26, 2010.

BACKGROUND OF THE INVENTION

1. Field of the Invention

The invention concerns a method to extract at least one diffusion direction from diffusion-weighted magnetic resonance signals (or DW-MR images for Diffusion-Weighted Magnetic Resonance images) of any part of a body that contains water molecules, comprising exposing the body to a magnetic resonance imaging process, in which at least one magnetic field gradient is applied to the entire body part, at least one magnetic resonance signal is measured in each voxel of said body part and at least one diffusion direction is determined based on said magnetic resonance signal.

Various methods to extract diffusion directions from DW-MRI data are known in the prior art.

2. Description of Related Art

Two main families of methods are known: on the one hand methods using diffusion tensor imaging DTI according to documents [1], [2] and [3], and on the other hand methods using high angular resolution diffusion imaging NARDI according to documents [4], [5] and [6].

Document [1] U.S. Pat. No. 5,539,310 describes a magnetic resonance spectroscopy system comprising: means for applying a static magnetic field to an object under examination; means for applying magnetic field gradients to the object; means for applying a high frequency pulse to the object; detecting means for detecting a magnetic resonance signal from the object; control means for ordering said means to apply magnetic field gradients, and means for applying a high frequency pulse to operate in a predetermined sequence so as to induce magnetic resonance within the object, wherein said control means includes means for generating a plurality of echo signals corresponding to non-collinear directions of said magnetic field gradients; and means for processing data based on the magnetic resonance signal detected by said detecting means to obtain magnetic resonance information, wherein said means for processing data provides an expression of each said echo signal in terms of a diffusion tensor that summarizes the displacements of water molecules due to the diffusion phenomenon primed by said magnetic field gradients.

Document [1] also provides an estimation of the diffusion tensor.

Document [2] US-2005/0007100 proposes an alternative method for the estimation of the diffusion tensor and furthermore q-space MRI specimen characterization. In q-space MRI, a sample portion is situated in a static magnetic field, typically for a duration long enough to permit some or all spins of one or more species like for example water molecules in the sample portion to align with the static magnetic field. It provides another method to estimate the diffusion tensor from DW-MR images, comprising: obtaining a set of diffusion-weighted magnetic resonance signals associated to a plurality of both magnetic field gradients strengths and directions; and estimating the values of the elements of the tensor D by application of a series of gradient pulses in different directions. According to the same, magnetic resonance methods include modelling magnetic resonance signals obtained from specimens at low and high q-values to obtain parameters associated with specimen structure (wherein brain white matter is a representative anisotropic specimen) and orientation. In evaluation of brain white matter specimens, diffusion within axons is modelled as restricted diffusion along the axon axis according to Neumann's model and as hindered diffusion in the plane perpendicular to the axon axis according to the Gaussian model.

Document [3] U.S. Pat. No. 6,526,305 concerns a method of fiber reconstruction employing data acquired by magnetic resonance imaging. A method of creating an image of brain white matter fibers includes exposing the brain white matter fibers to a magnetic resonance imaging process. The data acquisition from the magnetic resonance imaging includes the acquisition of diffusion-weighted magnetic resonance images that are later employed to calculate an apparent diffusion coefficient in each voxel. The data is introduced into a microprocessor which calculates the six parameters of a three-dimensional diffusion tensor and deduces its three eigenvalues and its three eigenvectors. These eigenvalues along with their associated eigenvectors are subjected to further microprocessing to generate a plurality of images representing a plurality of diffusion properties of the fibers. The process in a preferred embodiment includes that the input of an initiation pixel begins the reconstruction process which involves pixel connecting and ultimately judgement or a decision based upon the tracking reaching termination of the fiber in each direction. If comparison in the computer results in the conclusion that the end of the fiber has been reached ("yes"), that is the end of the process as to that axonal fiber. If not ("no"), the fiber reconstruction process continues. A method of creating an image of individual brain white matter fibers is provided comprising exposing said brain white matter fibers to a DW-MR imaging process, introducing data acquired from said magnetic resonance imaging process into a computer, estimating a diffusion tensor to obtain a plurality of scalar values and a plurality of vectors from said data, employing said values and said vectors to initiate brain fiber tracking at a pixel of interest, and continuing or terminating said fiber tracking based upon a determination regarding whether the fiber is continuous or terminated based on randomness of fiber orientation of adjacent pixels.

One problem of DTI-based methods using estimation of the diffusion tensor according to documents [1], [2] and [3] is that they do not permit to detect multiple fibres when the fibres are crossing. Another inconvenience of DTI is that it provides a bad estimation of the diffusion direction when the DW-MR images are too noisy.

Document [4] US-2008/0252291 concerns a High Angular Resolution Diffusion Weighted MRI (HARDI). A magnetic resonance imaging method involves acquisition of magnetic resonance signals with application of diffusion weighting at a plurality of diffusion weighting strengths and a plurality of diffusion directions. The occurrence of one single or several diffusion directions is identified for individual voxels. In this way account is taken of crossing fibres. However, the identification of crossing of fibres is detrimental to the acquisition load and time spent, because it requires a large amount of magnetic resonance (MRI) signals resulting from the application of a huge number of MR gradients.

Document [5] "Von Mises-Fisher Mixture Model of the diffusion ODF", Tim Mc Graw, Baba C. Vemuri, Bob Yeziersky, Thomas Mareci, concerns high angular resolution diffusion imaging (HARDI) that allows the computation of water molecules displacements probabilities in the whole three-dimensional space. This probability function is referred to as the orientation distribution function ODF which is known as the reverse Fourier transform of the DW-MR image. The ODF over the sphere is obtained by integrating the displacements probability over the radial component. The latter ODF over the sphere is modelled by means of a mixture of von Mises-Fisher distributions.

There is a high loss of information in the method of document [5], because two digital integrations are necessary. This high loss of information can only be compensated by making a greater number of MRI acquisitions, which are then more time-consuming. Furthermore, the ODF is sampled over a set of arbitrary directions and requires a learning algorithm, which makes it not easily and systematically able to be generalised to every clinical cases.

Document [6] "Hyperspherical von Mises-Fisher Mixture (HvMF) Modelling of High Angular Resolution Diffusion MRI", Ahhir Rhalerao, Carl-Fredrik Westin, MICCAI 2007, Part 1, LNCS 4791, pp 236-243, 2007, describes a mapping of unit vectors onto a 5D hypersphere to model and partition ODFs from HARDI data and makes a link to interpretation of the second order spherical harmonic decompositions of HARDI data.

The problem of techniques in documents [4], [5] and [6] using HARDI is that these methods require the acquisition of a large amount of magnetic resonance (MRI) signals resulting from the application of a huge number of MR gradients. A lower bound of this number is nowadays around 60, leading to a DW-MRI sequence of about 10 to 12 minutes. It is thus not easily applicable to clinical routine where lengthy acquisitions are often not possible on patients suffering from severe pathologies (e.g. psychiatry, multiple sclerosis, Parkinsonian disorders, paediatrics).

BRIEF SUMMARY OF THE INVENTION

A goal of the invention is to provide a method and device to detect diffusion direction(s) in a body, avoiding the inconveniences of the prior art, especially being more robust to noise with respect to DTI-based methods and reducing the acquisition time with respect to HARDI-based methods, and allowing to calculate more than one diffusion direction.

The invention provides a method to extract at least one diffusion direction from diffusion-weighted magnetic resonance signals of any part of a body that contains water molecules, comprising exposing the body to a magnetic resonance imaging process, in which at least one magnetic field gradient $q_i$ is applied to the entire body part, at least one magnetic resonance signal $S_i$ is measured in each voxel of said body part and at least one diffusion direction $\mu_j$ is determined based on said magnetic resonance signal $S_i$, characterized in that for a predetermined positive number m of diffusion direction(s) $\mu_j$ to be identified in each voxel of said body part with m≥1 said measured magnetic resonance signals $S_i$ are linked to the probability density function of the random vector X of water molecules displacements represented as a mixture of m probability density functions $p_{X_j}$ of random vectors $X_j$, each $p_{X_j}$ characterizing the diffusion along direction $\mu_j$, these random vectors $X_j$ being decomposed into a first component modelling directional variability of the water molecules displacements with $\mu_j$ as mean direction, and into a second component that models the length variability of the water molecules displacements along said mean direction $\mu_j$, wherein each of the m diffusion direction(s) $\mu_j$ is derived from N magnetic resonance signals $S_i$ acquired for respectively a plurality of N non-collinear magnetic field gradients $q_i$ applied to said body part, N being a positive integer≥2.

According to an embodiment of the invention, the first component is a 3-dimensional resealed random unit vector with $\mu_j$ as mean direction.

According to an embodiment of the invention, the first component is equal to $\gamma$ multiplied by $V_j$, wherein $V_j$ is a 3-dimensional random unit vector following a Von Mises & Fisher distribution with mean direction $\mu_j$ and concentration parameter $\kappa_j$ around said mean direction $\mu_j$, $\gamma$ is the mean distance covered by the water molecules diffusing along any diffusion direction $\mu_j$ during the given diffusion time $\tau$.

According to an embodiment of the invention, the second component $Z_j$ is a 3-dimensional random vector whose length varies along the mean direction $\mu_j$.

According to an embodiment of the invention, $V_j$ and $Z_j$ are independent.

According to an embodiment of the invention, the second component is equal $Z_j$, wherein $Z_j$ is a 3-dimensional centered Gaussian random vector whose covariance matrix $\Sigma_j$ is equal to $$\sum_j = \frac{\gamma^2}{\kappa_j+1}(I_3 + \kappa_j \mu_j \mu_j'),$$

wherein $I_3$ is the 3×3 identity matrix.

According to an embodiment of the invention, said measured magnetic resonance signals $S_i$ is the noisy version of the magnitude of DW-MR complex signal $A(q_i)$, said magnitude being denoted by $\Phi(q_i)$ and linked to the diffusion parameter $\theta$ through $$\phi(q_i \mid \Theta) = \phi_0 \sqrt{\left(\sum_{j=1}^M f_j R_j(-q_i \mid \theta_j, \gamma)\right)^2 + \left(\sum_{j=1}^M f_j I_j(-q_i \mid \theta_j, \gamma)\right)^2}$$

with $$R_j(-q_i \mid \theta_j, \gamma) = \begin{cases} \dfrac{\kappa_j}{\sinh \kappa_j} \dfrac{\sin\left(\gamma\sqrt{\|q_i\|^2 - (\kappa_j/\gamma)^2}\right)}{\gamma\sqrt{\|q_i\|^2 - (\kappa_j/\gamma)^2}} e^{-\frac{\gamma^2}{2(\kappa_j+1)}\|q_i\|^2}, & q_i \notin \Omega_{ij}, \\[2ex] \dfrac{\kappa_j}{\sinh \kappa_j} \dfrac{\alpha_j \sinh \alpha_j \cos \beta_j + \beta_j \cosh \alpha_j \sin \beta_j}{\alpha_j^2 + \beta_j^2} e^{-\frac{\gamma^2}{2(\kappa_j+1)}(\|q_i\|^2 + \kappa_j(\mu_j' q_i)^2)}, & q_i \notin \Omega_{ij}, \end{cases}$$

and

-continued $$I_j(-q_i \mid \theta_j, \gamma) = \begin{cases} 0, & q_i \notin \Omega_{ij}, \\ \dfrac{\kappa_j}{\sinh \kappa_j} \dfrac{\alpha_j \cosh \alpha_j \sin \beta_j - \beta_j \sinh \alpha_j \cos \beta_j}{\alpha_j^2 + \beta_j^2} e^{-\frac{\gamma^2}{2(\kappa_j+1)}(\|q_i\|^2 + \kappa_j(\mu_j' q_i)^2)}, & q_i \notin \Omega_{ij}, \end{cases}$$

wherein $q_i \mid \Theta$ means "given the diffusion parameters $\theta$", $$\theta_j = \{\mu_j, \kappa_j\}, \text{ for any } j=1,\ldots, M \text{ and } \Theta = \{\theta_1, \ldots, \theta_M, \gamma, f_1, \ldots, f_{M-1}\}.$$

wherein $\Phi_0$ is a given nominal value of the magnetic resonance signal $S_i$ when no gradient is applied,
wherein $f_j$ is the volume fraction of water molecules that diffuse along diffusion direction $\mu_j$, with $0 \le f_j \le 1$ and $$\sum_{j=1}^m f_j = 1,$$

wherein $\mu_j'$ is the transposition or vector $\mu_j$, $$\Omega_{ij} = \{-q_i \in \mathfrak{R}^3 : \|-q_i\| \ge \kappa_j / \gamma, \text{ and } -q_i \in (\text{span}(\mu_j))^\perp\}$$

$$\alpha_{ij} = \sqrt{\frac{\text{Re} z_{ij} + |z_{ij}|}{2}}$$

$$\beta_{ij} = \frac{\text{Im} z_{ij}}{\sqrt{2(\text{Re} z_{ij} + |z_{ij}|)}}$$

$$z_{ij} = \kappa_j^2 - \gamma^2 \|q_i\|^2 - 2i\kappa_j \gamma \mu_j' q_i$$

$(\text{span}(\mu_j))^\perp$ is the space orthogonal to $(\text{span}(\mu_j))$, where $(\text{span}(\mu_j))$ is the vector sub-space of $\mathfrak{R}^3$ generated by unit vector $\mu_j$.
It means that any vector of $\mathfrak{R}^3$ can be decomposed into the sum of a vector belonging to $(\text{span}(\mu_j))$ and of a vector belonging to $(\text{span}(\mu_j))^\perp$.
According to an embodiment of the invention, the concentration parameters are linked to the volume fractions $f_j$ by the following relationship $$\kappa_j = \kappa \cdot f_j$$

where $\kappa$ is a measure of anisotropy in the voxel, with $$\kappa = \sum_{j=1}^m \kappa_j.$$

According to an embodiment of the invention, a multiplicity of said voxels is provided, a magnetic resonance image of said voxels is reconstructed based at least on the values of the diffusion directions $\{\mu_j\}_{j=1,\ldots,m}$ of the m fibres calculated for each voxel.

The invention provides also an MRI device to carry out the method to extract at least one diffusion direction from diffusion-weighted magnetic resonance signals of any part of a body that contains water molecules as described above, comprising
an emitter-receiver exposing the body part to a diffusion-weighted magnetic resonance imaging process, comprising at least one emitter to apply at least one magnetic field diffusion gradient $q_i$ to the entire body part, and at least one receiver to measure at least one magnetic resonance signal $S_i$ in each voxel of said body part and a calculator to compute at least one diffusion direction $\mu_j$ based on said magnetic resonance signal $S_i$,
characterized in that
in said calculator, for a predetermined positive number m of diffusion direction(s) $\mu_j$ to be identified in each voxel of said body part with $m \ge 1$, said measured magnetic resonance signals $S_i$ are linked to the probability density function of the random vector X of water molecules displacements represented as a mixture of m probability density functions $p_{X_j}$ of random vectors $X_j$, each $p_{X_j}$ characterizing the diffusion along direction $\mu_j$, these random vectors $X_j$ being assumed independent and being decomposed into a first component modelling directional variability of the water molecules displacements with as mean direction, and into a second component that models the length variability of the water molecules displacements along said mean direction $\mu_j$,
wherein in the calculator each of the m diffusion direction(s) $\mu_j$ is derived from N magnetic resonance signals $S_i$ measured for respectively a plurality of N non-collinear magnetic field gradients $q_i$ applied to said body part, N being a positive integer $\ge 2$.

BRIEF DESCRIPTION OF THE DRAWINGS

The invention will be better understood on reading the following description giving solely as an example of embodiment in reference to the drawings in which.

DETAILED DESCRIPTION OF THE INVENTION

Figure 1:
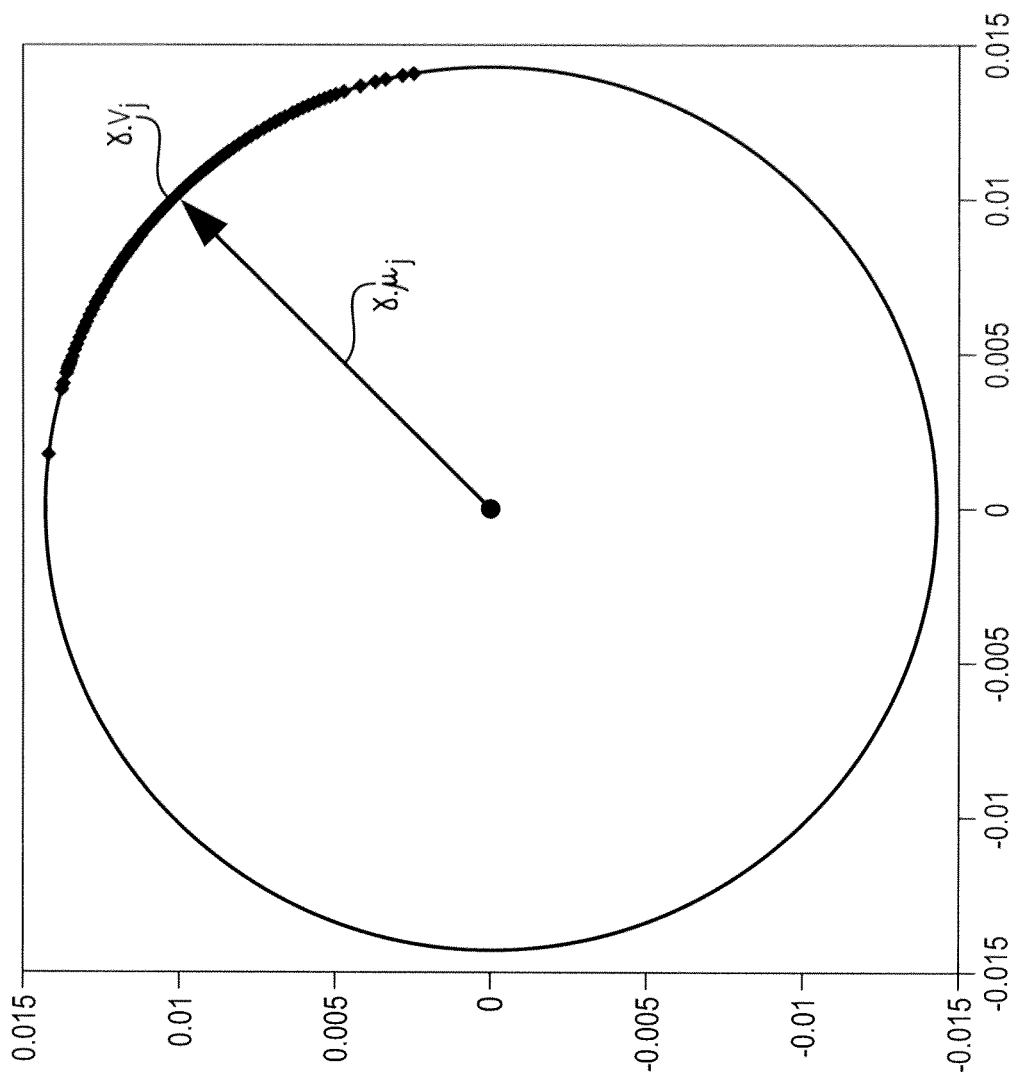
FIG. 1 shows an example of the first component according to the invention, wherein the horizontal and vertical axis are graduated in meters.

The principle of Diffusion-Weighted Magnetic Resonance Imaging (DW-MRI) is to apply sequentially several magnetic field diffusion gradients $q_i$, and to measure, for each of them, their impact on the displacements of water molecules along at least one fibre through the magnetic resonance signal $S_i$, in each voxel of the image. It is provided that N non-collinear magnetic field diffusion gradients $q_i$ are successively applied with i being an integer, which indexes each magnetic field diffusion gradient $q_i$ and which takes N different values with $1 \le i \le N$ and $N \ge 2$, N being a positive integer.
The body to which the magnetic field diffusion gradients are applied is for example the brain of a living human being, in order to detect the orientation of nervous fibres in the brain, constituting the so-called brain white matter, which comprise water molecules and axons. The body can be any part of the living human being provided that there are water molecules, like for example the liver or the heart. The body can be also the body of a living animal.

For each given voxel of the body part, the MR imager gives a complex response signal $A(q_i)$ to each magnetic field diffusion gradient $q_i$. The modulus $S(q_i)$ of the complex response signal $A(q_i)$ is referred to as the measured magnetic resonance signal or MR signal.

The complex measurement $A(q_i)$ is the Fourier transform of the probability density function (pdf) $p_X(x)$ of the random vector X of water molecules displacements in said voxel according to the following equation (1):

$$\frac{A(q_i)}{A(0)} = \int_{R^3} p_X(x) \exp\{-iq_i'x\}dx = \varphi_X(-q_i)$$

wherein $\phi_X$ is the characteristic function of the 3-dimensional random vector X of water molecules displacements.

According to the invention, m fibre(s) direction(s) are searched in the voxel or in each of the voxels, wherein m is a pre-determined positive integer equal to one or greater than one, $m \geq 1$.

It is considered that each fibre j (with j being an integer between 1 and m) extends along an associated diffusion direction $\mu_j$ in the considered voxel, i.e. dimensional random unit vector in the voxel. Diffusion directions $\mu_j$ are assumed to coincide with fibre directions.

The invention provides means to find the diffusion/fibre directions $\{\mu_j\}_{j=1, \ldots, m}$ directly from the acquired signals $A\{q_i\}_{i=1, \ldots, N}$.

According to the invention, the random vector $X_j$ of the water molecules displacements along each fibre j is as follows:

$$X_j = \gamma \cdot V_j + Z_j$$

The first component $\gamma \cdot V_j$ of the random vector $X_j$ of water molecules displacements i a 3-dimensional random vector having direction $\mu_j$ as mean direction.

$V_j$ is a 3-dimensional random unit vector distributed as a Von Mises & Fisher random unit vector having diffusion direction $\mu_j$ as mean direction and concentration parameter $\kappa_j$ around said mean direction $\mu_j$.

$\gamma$ is the mean distance covered by water molecules diffusing along any diffusion direction $\mu_j$ during the given diffusion time $\tau$.

Figure 2:
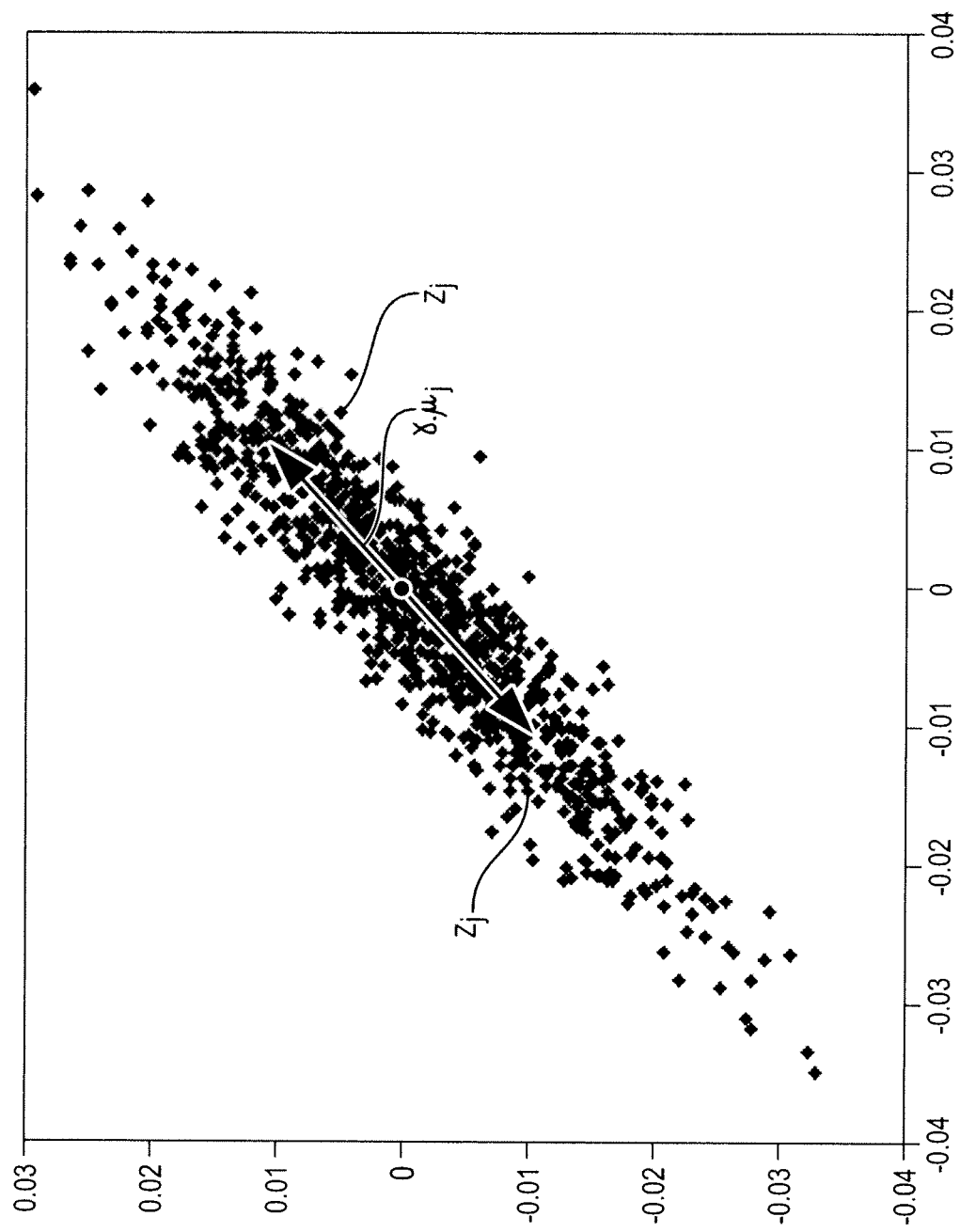
FIG. 2 shows an example of the second component according to the invention, wherein the horizontal and vertical axis are graduated in meters.

The second component $Z_j$ of the random vector $X_j$ of water molecules displacements is a 3-dimensional random vector whose length varies along the diffusion direction $\mu_j$, as shown for example on FIG. 2, in which the points are simulations of $Z_j$.

In an embodiment, $N \geq 4m$. This allows to estimate not only the diffusion direction $\mu_j$ but also the concentration parameter $\kappa_j$ and the mean distance $\gamma$.

The second component is equal to $Z_j$, wherein $Z_j$ is a 3-dimensional centered Gaussian random vector whose covariance matrix $\Sigma_j$ is equal to $$\sum_j = \frac{\gamma^2}{\kappa_j + 1}(I_3 + \kappa_j \mu_j \mu_j'),$$

wherein $I_3$ is the 3×3 identity matrix, and $V_j$ and $Z_j$ are independent.

The displacement vector $X_j$ of the water molecules is the sum of two independent components:

the first component $\gamma \cdot V_j$ takes into account the directional variability of water molecules displacements by estimating the diffusion/fibre direction $\mu_j$ on the sphere given the covered mean diffusion distance as radius;

the second component $Z_j$ takes into account the length variability of water molecules displacements by estimating the covered mean diffusion distance $\gamma$ given the diffusion/fibre direction $\mu_j$ as direction along which water molecules diffuse.

The overall estimation is performed by the estimation of these two parts of the above equation simultaneously.

According to an embodiment, the role of $\kappa_j$ is to provide a measure of anisotropy along the diffusion direction $\mu_j$. Parameter $\kappa_j$ evaluates the concentration of the data around the mean direction $\mu_j$. The greater the value of $\kappa_j$, the higher the concentration of the data around the mean direction $\mu_j$, as shown for example on FIG. 1, in which the simulated displacement direction $\gamma \cdot V_j$ of water molecules is shown around the mean direction $\mu_j$. Several $\kappa_j$'s, but not all of them, equal to 0, means that the number m of diffusion directions, i.e. the number m of fibres is over estimated, and there is no need to consider so many diffusion directions $\{\mu_j\}_{j=1, \ldots, m}$. Therefore, the expected water molecules displacement $X_j$ towards these directions $\mu_j$ for which $\kappa_j = 0$ must be and is indeed null. All the $\kappa_j$'s equal to 0 means that the region is isotropic and the proposed model is coherent with this situation in the sense described below: the MRI signal is invariant to changes of directions of gradients $q_i$, as there are no preferred directions anymore. Finally, when $\kappa_j > 0$ for every j, the expected water molecules displacement $X_j$ towards any direction is equal to $\gamma \cdot \mu_j$ as expected, i.e., the mean covered distance multiplied by the mean direction.

Figure 3:
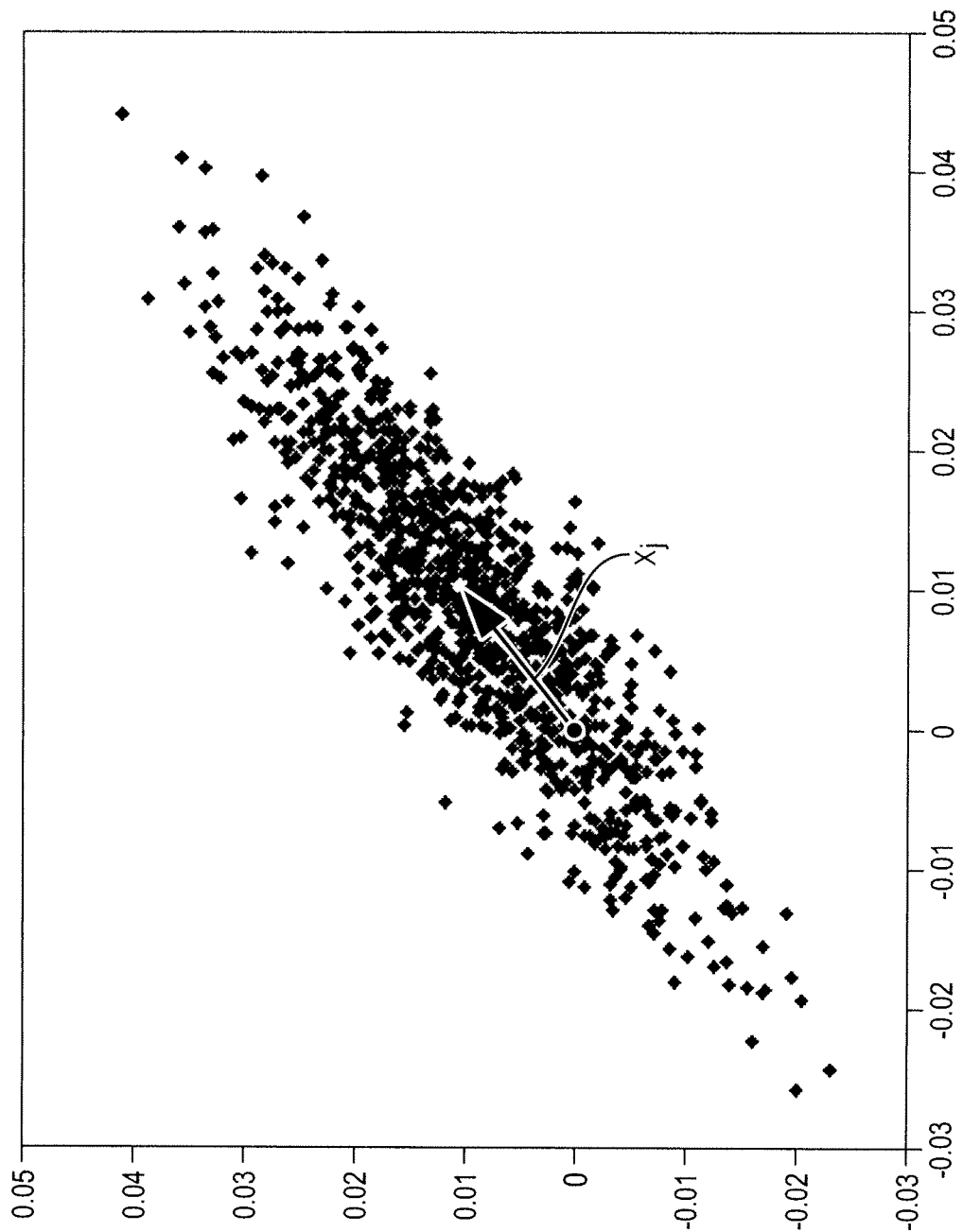
FIG. 3 shows the result of the first and second components according to FIGS. 1 and 2.
Figure 4:
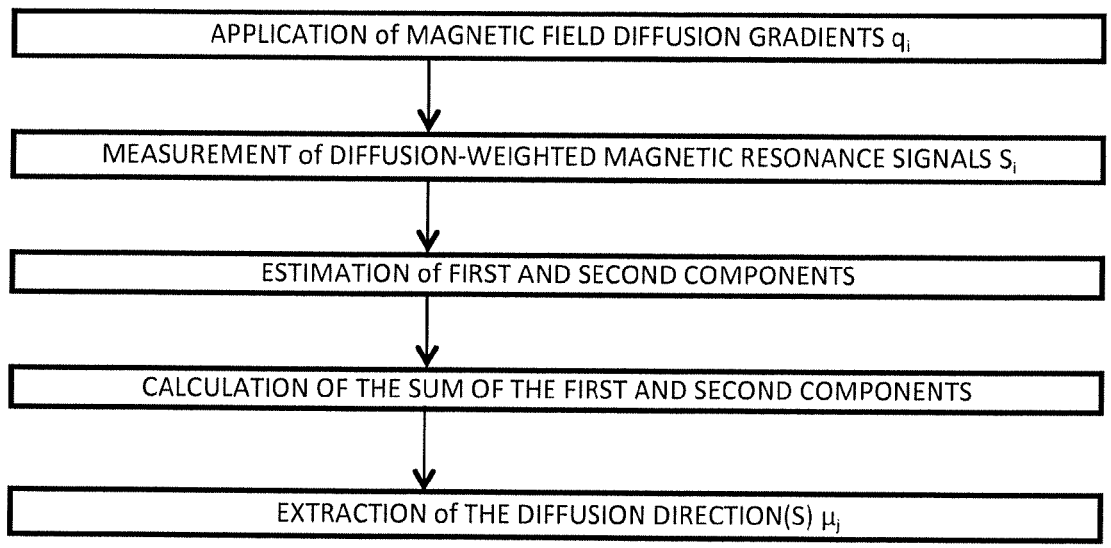
FIG. 4 is a flow chart showing the steps performed according to one embodiment of the invention.
Figure 5:
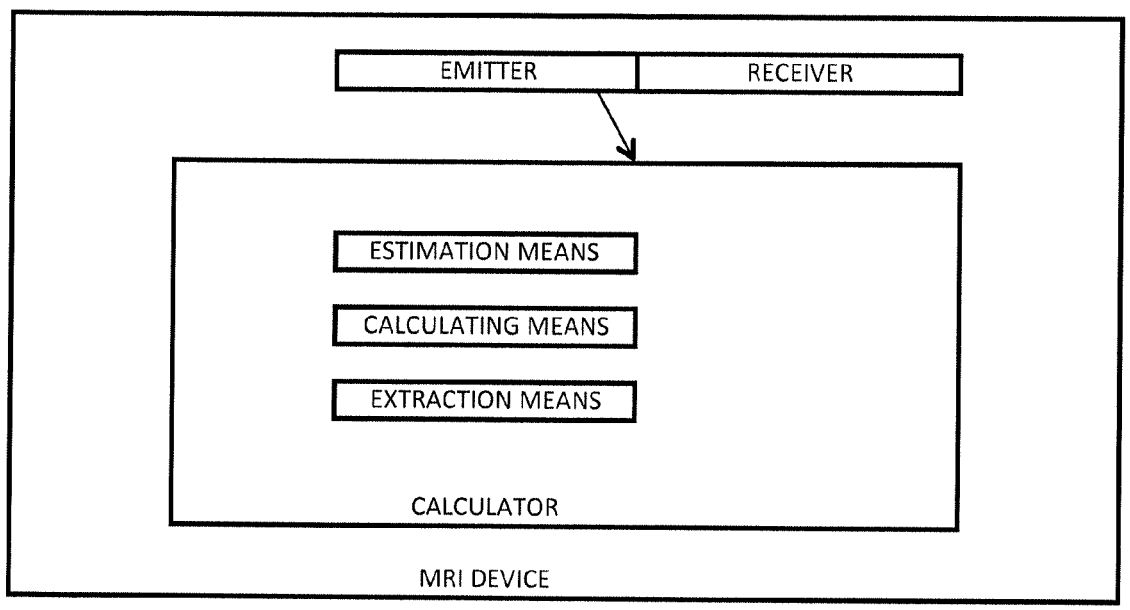
FIG. 5 is a block diagram showing elements according to one embodiment of the invention.

The sum of the first component of FIG. 1 and of the second component of FIG. 2 gives the displacement vector $X_j$ of FIG. 3.

In an improvement, the concentration parameters are linked to the volume fractions $f_j$ by the following relationship $$\kappa_j = \kappa \cdot f_j$$

where $\kappa$ is a measure of anisotropy in the voxel, with $$\kappa = \sum_{j=1}^{m} \kappa_j$$

With this improvement, sensitivity to noise is furthermore reduced.

These parameters $\{\mu_j\}_{j=1, \ldots, m}, \{\kappa_j\}_{j=1, \ldots, m}$ and $\gamma$ are part of the definition of the probability density function (pdf) $p_X$ of water molecules displacements $X_j$ due to the diffusion process. The parameters are extracted as follows.

In the context of multi-fibres detection, it is convenient to propose a mixture model for $p_X$. It consists in modelling $p_X$ according to $$p_X(x) = \sum_{j=1}^{m} f_j p_{Xj}(x)$$

wherein $f_j$ is the volume fraction of water molecules that diffuse along diffusion direction $\mu_j$ or along fibre j with $0 \leq f_j \leq 1$ and $$\sum_{j=1}^{m} f_j = 1.$$

This assumption induces the following relationship between the MRI signal and the mixed densities $p_{Xj}$:

$$\frac{A(q_i \mid \Theta)}{A(0)} = \sum_{j=1}^{m} f_j \varphi_{Xj}(-q_i \mid \theta_j, \gamma)$$

where $\{\phi_{Xj}\}_{j=1,\ldots,m}$ are the characteristic functions of the 3-dimensional random vectors $X_j$, assumed independent and having probability density function $p_{Xj}$, where $\theta_j = \{\mu_j, \kappa_j\}$, for any $j=1, \ldots, M$ and $\Theta = \{\theta_1, \ldots, \theta_M, \gamma, f_1, \ldots, f_{M-1}\}$.

Denote by $R_j$ and $I_j$ the real and imaginary parts of $\phi_{Xj}$, respectively. Then, $$\text{Re}\left[\frac{A(q_i \mid \Theta)}{A(0)}\right] = \sum_{j=1}^{M} f_j R_j(-q_i \mid \theta_j, \gamma),$$

$$\text{Im}\left[\frac{A(q_i \mid \Theta)}{A(0)}\right] = \sum_{j=1}^{M} f_j I_j(-q_i \mid \theta_j, \gamma),$$

The derivation of the model is then given by the following equations:

$$R_j(-q_i \mid \theta_j, \gamma) = \begin{cases} \dfrac{\kappa_j}{\sinh \kappa_j} \dfrac{\sin\left(\gamma \sqrt{\|q_i\|^2 - (\kappa_j/\gamma)^2}\right)}{\gamma \sqrt{\|q_i\|^2 - (\kappa_j/\gamma)^2}} e^{-\frac{\gamma^2}{2(\kappa_j+1)}\|q_i\|^2}, & q_i \notin \Omega_{ij}, \\ \dfrac{\kappa_j}{\sinh \kappa_j} \dfrac{\alpha_j \sinh \alpha_j \cos \beta_j + \beta_j \cosh \alpha_j \sin \beta_j}{\alpha_j^2 + \beta_j^2} e^{-\frac{\gamma^2}{2(\kappa_j+1)}(\|q_i\|^2 + \kappa_j(\mu'_j q_i)^2)}, & q_i \notin \Omega_{ij}, \end{cases}$$

and $$I_j(-q_i \mid \theta_j, \gamma) = \begin{cases} 0, & q_i \notin \Omega_{ij}, \\ \dfrac{\kappa_j}{\sinh \kappa_j} \dfrac{\alpha_j \cosh \alpha_j \sin \beta_j - \beta_j \sinh \alpha_j \cos \beta_j}{\alpha_j^2 + \beta_j^2} e^{-\frac{\gamma^2}{2(\kappa_j+1)}(\|q_i\|^2 + \kappa_j(\mu'_j q_i)^2)}, & q_i \notin \Omega_{ij}, \end{cases}$$

The modulus of $$\frac{A(q_i)}{A(0)}$$

is given by $$\frac{\Phi_i(q_i)}{\Phi_0},$$

with equation (E) below:

$$\phi(q_i \mid \Theta) = \phi_0 \sqrt{\left(\sum_{j=1}^{M} f_j R_j(-q_i \mid \theta_j, \gamma)\right)^2 + \left(\sum_{j=1}^{M} f_j I_j(-q_i \mid \theta_j, \gamma)\right)^2}$$

wherein
$\Phi_0$ is the given nominal magnetic resonance signal when no MR gradient is applied.

In the equations, R or Re is the real part and I or Im is the imaginary part, and the operator $\mu'_j$ is the transposition of vector $\mu_j$.

The above model for the pdf of the random vector X of water molecules displacements is a coherent and realistic representation of the diffusion process in terms of $\mu_j$, $\kappa_j$, $f_j$ and $\gamma$. Its characteristic function can also be analytically derived.

By coherent, we intend the following behaviour. Suppose that m=1, i.e, there is one fiber direction at concerned voxel. If $\kappa_j \gg 0$ or $\kappa_j \gg 0$, i.e, if the data are highly concentrated around the diffusion direction, it characterizes an anisotropic region and, thus, the expected value of the random vector X of water molecules is equal to $\gamma \mu$. On the contrary, if $\kappa_j = 0$ or $\kappa = 0$, i.e. if the data are uniformly distributed on the sphere, it characterizes an isotropic region and, thus, the expected value of the random vector X of water molecules is null and the MRI signal variation is the same no matter what magnetic field gradient direction is applied.

By a realistic representation of the diffusion process, it is understood that a fundamental difference between the above-mentioned DTI model of document [1] and the invention is that DTI implies symmetry of the probability density function of the random vector X of water molecules, whereas the invention build it asymmetric. In each voxel, the DTI allows the water molecules to diffuse indifferently in a direction and in its opposite direction. On the contrary, the invention allows only the diffusion in one direction and not in its opposite direction which has low probability to occur. Hence, the invention not only covers the real case of one fibre covered by DTI, but also the case of fibre crossings much better than DTI. For example in case of a fibre bifurcating, the water molecules should be allowed only to diffuse along 2 directions and not also along the 2 opposite directions where DTI allows them to move which would involve that the water molecules could go against a "wall".

Then the values of the m diffusion/fibre direction(s) $\mu_j$ are calculated in each voxel from the N magnetic resonance signals $S_i$ acquired for N different magnetic field diffusion gradients $q_i$ applied to each voxel. The application of at least 4 m different magnetic field diffusion gradients $q_i$ enables to solve the underlying minimization problem to find the m diffusion/ fibre direction(s) $\mu_j$ along with concentration parameter $\kappa_j$ and the covered mean distance $\gamma$ in each voxel of the brain.

The above measured signal $\{S_i(q_i)\}_{j=1,\ldots,m}$ is affected by noise.

The following noise model is minimized $$S(q_i \mid \Theta, \sigma) = \text{Rice}(\phi(q_i \mid \Theta), \sigma)$$

$$= \text{Rice}\left(S_0 \sqrt{\left(\sum_{j=1}^{M} f_j R_j(-q_i \mid \theta_j, \gamma)\right)^2 + \left(\sum_{j=1}^{M} f_j I_j(-q_i \mid \theta_j, \gamma)\right)^2}, \sigma\right).$$

One way to approximate the Rician law to normality is due to Salvador, R., Pena, A., Menon, D. K., Carpenter, T. A., Pickard, J. D., and Bullmore. F. T. (2005), Formal characterization and extension of the linearised diffusion tensor model. Human Brain Mapping, 24:144-155. They show that the magnitude DW-MR images' logarithm $\log(S(q|\theta,\sigma))$, which is theoretically log-Rician, can be considered Gaussian with mean parameter $\log \Phi(q|\theta,\sigma))$ and standard deviation $\sigma/\Phi$ $(g|\theta)$, for any SNR≥3, wherein SNR=$\Phi(q|\theta)/\sigma$. An efficient solution to estimate the diffusion parameters is then to perform a weighted least squares (WLS) optimization, since the variance of the approximating Gaussian distribution varies from one image to another one. These weights $w(q)$ need to be estimated. Once notice that the variance of the approximately Gaussian-distributed random variable $\Phi(q|\theta,\sigma)\log(S(q\theta,\sigma))$ is equal to $\sigma^2$, constant for all the magnitude DW-MR images, and assuming to know good prior estimates $\hat{\Theta}$ of the diffusion parameters $\theta$, we set $w(q)=\Phi(q|\hat{\Theta})^2$. Good prior estimate $\hat{\Theta}$ can be found by performing a direct Least Squares optimization as suggested by above-mentioned Salvador et al.'s (2005), i.e, $$\hat{\Theta} = \arg\min_{\Theta} \sum_{i=1}^{N} (\log S(q_i) - \log \phi(q_i \mid \Theta))^2$$

to estimate the diffusion parameters $\theta$.

The problem of the choice of the number of fibers m is a so-called model selection problem. As explained above, if the chosen value of m is higher than the true value, the model tells us to reduce it by estimating some of the $\kappa_j$'s around zero. There are also several methods in the literature to overcome such a problem; for instance, the minimization of the Akaike Information Criterion (AIC) is one of them.

The whole method enables to use only 4 m different q to calculate each diffusion direction $\mu_j$. Of course, more than 4 different $q_i$ can be used to calculate each diffusion direction $\mu_j$. Then 4 m different $q_i$ are sufficient to calculate the m diffusion direction $\mu_j$. Of course, more than 4 m different $q_i$ can be used to calculate the m diffusion directions $\mu_j$.

Thus the number N of magnetic field diffusion gradient $q_i$ to apply for the DW-MRI sequence is reduced in view of the state of the art.

If it is assumed that a clinical limit of an MRI examination carried out on a human being is that the time spent by the human being in the MRI device for the DW-MRI sequence should not exceed three minutes, it allows the application of around N=30 magnetic field diffusion gradient $q_i$ successively and thus allows the detection of m=4 fibre-crossings in each voxel, letting 13 acquisitions to confer to the estimates robustness to noise.

In case of using $\kappa_j=\kappa \cdot f_j$, there are (3 m+2) parameters to estimate. Then, in an example to estimate m=4 fibres, it gives N−1−m=30−1−(3*4+2)=15 acquisitions for robustness to noise.

An MRI image is reconstructed based on the values of diffusion directions $\{\mu_j\}_{j=1,\ldots,m}$ of the m fibres calculated in each voxel by the above process. In each voxel, the fibre(s) j, for j going from 1 to m, extend along the diffusion directions $\{\mu_j\}_{j=1,\ldots,m}$. Then the image can be displayed, and/or stored, wherein a multiplicity of voxels for which the above calculation process has been carried out enables to reconstruct multiple fibres in each voxel, and to detect fibre-crossings in case of different $\mu_j$ in the same voxel.

Scalar maps of $\gamma$ and $\kappa$ defined as the sum of the $\kappa_j$ as described above can also be made.

The method is automatically executed by a computer calculating for each given number m of fibre(s) the m diffusion directions $\{\mu_j\}_{j=1,\ldots,m}$ of the m fibres in each voxel of the image, and possibly also the m parameters $\{\kappa_j\}_{j=1,\ldots,m}$ and parameter $\gamma$, parameters $f_j$ and/or $\kappa$ defined as the sum of the $\kappa_j$ as described above based on the given applied magnetic field diffusion gradients $\{q_i\}_{i=1,\ldots,N}$ and the resulting acquired magnetic resonance signals $\{S_i\}_{i=1,\ldots,N}$ wherein at least an emitter to apply the magnetic field diffusion gradients $\{q_i\}_{i=1,\ldots,N}$ and a receiver to receive the acquired magnetic resonance signals $\{S_i\}_{i=1,\ldots,N}$ are provided.

The invention claimed is:

1. A method using an MRI device to extract m diffusion direction(s) $\mu_j$ from N diffusion-weighted magnetic resonance signals $S_i$ of any part of a body that contains water molecules, wherein m is a predetermined positive number m of diffusion direction(s) $\mu_j$ to be identified in each voxel of said body part with m≥1, comprising exposing by an emitter-receiver the body to a magnetic resonance imaging process, in which N magnetic field diffusion gradients $q_i$, which are non-collinear, are applied by at least one emitter to the entire body part with N being a positive integer ≥2 and the N diffusion-weighted magnetic resonance signals $S_i$ are measured by at least one receiver in each voxel of said body part, wherein using a calculator a first component modelling directional variability of water molecules displacements with diffusion direction $\mu_j$ as mean direction and a second component that models a length variability of the water molecules displacements along said diffusion direction $\mu_j$ are estimated from the N diffusion-weighted magnetic resonance signals $S_i$ for each of the in diffusion direction(s) $\mu_j$, wherein a sum of the first component and of the second component is calculated in the calculator for each of the m diffusion direction(s) $\mu_j$, wherein, for each of the m diffusion direction(s) $\mu_j$, the diffusion direction $\mu_j$ is extracted in the calculator from the sum being a random vector $X_j$ of the water molecules displacements having a probability density function $p_{X_j}$ characterizing the diffusion along the diffusion direction $\mu_j$ and for respectively the N magnetic field gradients $q_i$ applied to said body part.

2. Method according to claim 1, characterized in that the first component is a 3-dimensional resealed random unit vector with diffusion direction $\mu_j$ as mean direction.

3. Method according to claim 1 or 2, wherein the first component is equal to $\gamma$ multiplied by $V_j$, wherein $V_j$ is a 3-dimensional random unit vector following a Von Mises & Fisher distribution with mean direction $\mu_j$ and concentration parameter $\kappa_j$ around said mean direction $\mu_j$, $\gamma$ is the mean distance covered by the water molecules diffusing along any diffusion direction $\mu_j$ during a given diffusion time $\tau$.

4. Method according to claim 1, wherein the second component $Z_j$ is a 3-dimensional random vector whose length varies along the diffusion direction $\mu_j$.

5. Method according to claim 3, wherein $V_j$ and the second component $Z_j$ are independent.

6. Method according to claim 5 wherein the second component is equal to $Z_j$, wherein $Z_j$ is a 3-dimensional centered Gaussian random vector whose covariance matrix $\Sigma_j$ is equal to $$\sum_j = \frac{\gamma^2}{\kappa_j+1}(I_3 + \kappa_j \mu_j \mu_j'),$$

wherein $I_3$ is the 3×3 identity matrix, and wherein $\mu_j'$ is a transposition of a vector corresponding to diffusion direction $\mu_j$.

7. Method according to claim 3, wherein the N diffusion-weighted magnetic resonance signals $S_i$ are the noisy version of a magnitude of DW-MR complex signals $A(q_i)$, said magnitude being denoted by $\Phi(q_i)$ and linked to a diffusion parameter $\theta$ through $$\phi(q_i \mid \Theta) = \phi_0 \sqrt{\left(\sum_{j=1}^{M} f_j R_j(-q_i \mid \theta_j, \gamma)\right)^2 + \left(\sum_{j=1}^{M} f_j I_j(-q_i \mid \theta_j, \gamma)\right)^2}$$

with $$R_j(-q_i \mid \theta_j, \gamma) = \begin{cases} \frac{\kappa_j}{\sinh \kappa_j} \frac{\sin\left(\gamma\sqrt{\|q_i\|^2 - (\kappa_j/\gamma)^2}\right)}{\gamma\sqrt{\|q_i\|^2 - (\kappa_j/\gamma)^2}} e^{-\frac{\gamma^2}{2(\kappa_j+1)}\|q_i\|^2}, & q_i \notin \Omega_{ij}, \\ \frac{\kappa_j}{\sinh \kappa_j} \frac{\alpha_j \sinh\alpha_j \cos\beta_j + \beta_j \cosh\alpha_j \sin\beta_j}{\alpha_j^2 + \beta_j^2} e^{-\frac{\gamma^2}{2(\kappa_j+1)}(\|q_i\|^2 + \kappa_j(\mu_j'q_i)^2)}, & q_i \notin \Omega_{ij}, \end{cases}$$

and $$I_j(-q_i \mid \theta_j, \gamma) = \begin{cases} 0, & q_i \notin \Omega_{ij}, \\ \frac{\kappa_j}{\sinh \kappa_j} \frac{\alpha_j \cosh\alpha_j \sin\beta_j - \beta_j \sinh\alpha_j \cos\beta_j}{\alpha_j^2 + \beta_j^2} e^{-\frac{\gamma^2}{2(\kappa_j+1)}(\|q_i\|^2 + \kappa_j(\mu_j'q_i)^2)}, & q_i \notin \Omega_{ij}, \end{cases}$$

wherein $q_i \mid \Theta$ means "given the diffusion parameters $\theta$", $\theta_j = \{\mu_j, \kappa_j\}$, for any $j=1, \ldots, M$ and $\Theta = \{\theta_1, \ldots, \theta_M, \gamma, f_1, \ldots, f_{M-1}\}$, wherein $\Phi_0$ is a given nominal value of the diffusion-weighted magnetic resonance signal $S_i$ when no magnetic field diffusion gradient $q_i$ is applied, wherein $f_j$ is the volume fraction of water molecules that diffuse along diffusion direction $\mu_j$, with $0 \leq f_j \leq 1$ and $$\sum_{j=1}^{m} f_j = 1,$$

wherein $\mu_j'$ is a transposition of a vector corresponding to diffusion direction $\mu_j$, $$\Omega_{ij} = \{-q_i \in \mathfrak{R}^3 : \|-q_i\| \geq \kappa_j / \gamma,$$

and $$-q_i \in (\text{span}(\mu_j))^\perp]$$

$$\alpha_{ij} = \sqrt{\frac{\text{Re} z_{ij} + |z_{ij}|}{2}}$$

$$\beta_{ij} = \frac{\text{Im} z_{ij}}{\sqrt{2(\text{Re} z_{ij} + |z_{ij}|)}}$$

$$z_{ij} = \kappa_j^2 - \gamma^2 \|q_i\|^2 - 2i\kappa_j \gamma \mu_j' q_i$$

$(\text{span}(\mu_j))^\perp$ is a space orthogonal to $(\text{span}(\mu_j))$, where $(\text{span}(\mu_j))$ is a vector sub-space of $\mathfrak{R}$ generated by unit vector $\mu_j$.

8. Method according to claim 7, wherein the concentration parameters $\kappa_j$ are linked to the volume fractions $f_j$ by the following relationship $$\kappa_j = \kappa \cdot f_j$$

where $\kappa$ is a measure of anisotropy in the voxel, with $$\kappa = \sum_{j=1}^{m} \kappa_j.$$

9. Method according to claim 1 or claim 2, wherein a multiplicity of said voxels is provided, a magnetic resonance image of said voxels is reconstructed by the calculator based at least on the values of the diffusion directions $\mu_j$ calculated for each voxel.

10. An MRI device to extract m diffusion direction(s) $\mu_j$ from N diffusion-weighted magnetic resonance signals $S_j$ of any part of a body that contains water molecules, wherein m is a predetermined positive number of diffusion direction(s) $\mu_j$ to be identified in each voxel of said body part with $m \geq 1$, comprising an emitter-receiver for exposing the body to a magnetic resonance imaging process, the emitter-receiver comprising at least one emitter for applying N magnetic field diffusion gradients $q_i$, which are non-collinear, to the entire body part with N being a positive integer $\geq 2$ and at least one receiver for measuring the N diffusion-weighted magnetic resonance signals $S_i$ in each voxel of said body part, a calculator having means to estimate, for each of the m diffusion direction(s) $\mu_j$, a first component modelling directional variability of water molecules displacements with diffusion direction $\mu_j$ as mean direction and a second component that models a length variability of the water molecules displacements along said diffusion direction $\mu_j$ from the N diffusion-weighted magnetic resonance signals $S_i$, wherein the calculator has means to calculate a sum of the first component and of the second component for each of the m diffusion direction(s) $\mu_j$, wherein the calculator has means to extract, for each of the in diffusion direction(s) $\mu_j$, the diffusion direction $\mu_j$ from the sum being a random vector $X_j$ of the water molecules displacements having a probability density function $p_{X_j}$ characterizing the diffusion along the diffusion direction $\mu_j$ and for respectively the N magnetic field diffusion gradients $q_i$ applied to said body part.

* * * * *

UNITED STATES PATENT AND TRADEMARK OFFICE
CERTIFICATE OF CORRECTION

PATENT NO. : 8,907,671 B2
APPLICATION NO. : 13/299309
DATED : December 9, 2014
INVENTOR(S) : Aymeric Stamm, Christian Barillot and Patrick Perez It is certified that error appears in the above-identified patent and that said Letters Patent is hereby corrected as shown below:

On the Title Page, in Item [75], under Inventors, at line 1, please delete "Argertre de Plesses" and insert --Argentre de Plessis--.

In the Specification,

Column 9, line 40, please delete " $, q_i \notin \Omega_{ij}$ " and insert -- $, q_i \in \Omega_{ij}$ --.

Column 9, line 50, please delete " $, q_j \notin \Omega_{ij}$ " and insert -- $, q_j \in \Omega_{ij}$ --.

In the Claims,

Column 13, Claim 7, line 40, please delete " $, q_j \notin \Omega_{ij}$ " and insert -- $, q_j \in \Omega_{ij}$ --.

Column 13, Claim 7, line 50, please delete " $, q_j \notin \Omega_{ij}$ " and insert -- $, q_j \in \Omega_{ij}$ --.

Column 15, Claim 10, line 22, please delete "in diffusion" and insert --m diffusion--.

Signed and Sealed this
Fourth Day of August, 2015

Michelle K. Lee
*Director of the United States Patent and Trademark Office*

UNITED STATES PATENT AND TRADEMARK OFFICE
CERTIFICATE OF CORRECTION

Page 1 of 2

PATENT NO.        : 8,907,671 B2
APPLICATION NO.   : 13/299309
DATED             : December 9, 2014
INVENTOR(S)       : Stamm et al.

It is certified that error appears in the above-identified patent and that said Letters Patent is hereby corrected as shown below:

On the Title Page, in Item [75], under Inventors, at line 1, please delete "Argertre de Plesses" and insert --Argentre de Plessis--.

In the Specification,

Column 9, lines 37-53 please delete the existing equation and insert $$R_j(-q_i \mid \theta_j, \gamma) = \begin{cases} \dfrac{\kappa_j}{\sinh \kappa_j} \dfrac{\sin\left(\gamma\sqrt{\|q_i\|^2 - (\kappa_j/\gamma)^2}\right)}{\gamma\sqrt{\|q_i\|^2 - (\kappa_j/\gamma)^2}} e^{-\frac{\gamma^2}{2(\kappa_j+1)}\|q_i\|^2}, & q_i \in \Omega_{ij}, \\ \dfrac{\kappa_j}{\sinh \kappa_j} \dfrac{\alpha_j \sinh\alpha_j \cos\beta_j + \beta_j \cosh\alpha_j \sin\beta_j}{\alpha_j^2 + \beta_j^2} e^{-\frac{\gamma^2}{2(\kappa_j+1)}\left(\|q_i\|^2 + \kappa_j(\mu_j' q_i)^2\right)}, & q_i \notin \Omega_{ij}, \end{cases}$$

and $$I_j(-q_i \mid \theta_j, \gamma) = \begin{cases} 0, & q_i \in \Omega_{ij}, \\ \dfrac{\kappa_j}{\sinh \kappa_j} \dfrac{\alpha_j \cosh\alpha_j \sin\beta_j - \beta_j \sinh\alpha_j \cos\beta_j}{\alpha_j^2 + \beta_j^2} e^{-\frac{\gamma^2}{2(\kappa_j+1)}\left(\|q_i\|^2 + \kappa_j(\mu_j' q_i)^2\right)}, & q_i \notin \Omega_{ij}, \end{cases}$$

--

This certificate supersedes the Certificate of Correction issued August 4, 2015.

Signed and Sealed this
Ninth Day of February, 2016

Michelle K. Lee
*Director of the United States Patent and Trademark Office*

CERTIFICATE OF CORRECTION (continued)
U.S. Pat. No. 8,907,671 B2

In the Claims,

Column 13, Claim 7, lines 40-50 please delete the existing equation and insert $$R_j(-q_i \mid \theta_j, \gamma) = \begin{cases} \dfrac{\kappa_j}{\sinh \kappa_j} \dfrac{\sin\left(\gamma \sqrt{\|q_i\|^2 - (\kappa_j/\gamma)^2}\right)}{\gamma \sqrt{\|q_i\|^2 - (\kappa_j/\gamma)^2}} e^{-\frac{\gamma^2}{2(\kappa_j+1)}\|q_i\|^2}, & q_i \in \Omega_{ij}, \\ \dfrac{\kappa_j}{\sinh \kappa_j} \dfrac{\alpha_j \sinh \alpha_j \cos \beta_j + \beta_j \cosh \alpha_j \sin \beta_j}{\alpha_j^2 + \beta_j^2} e^{-\frac{\gamma^2}{2(\kappa_j+1)}(\|q_i\|^2 + \kappa_j(\mu_j' q_i)^2)}, & q_i \notin \Omega_{ij}, \end{cases}$$

and $$I_j(-q_i \mid \theta_j, \gamma) = \begin{cases} 0, & q_i \in \Omega_{ij}, \\ \dfrac{\kappa_j}{\sinh \kappa_j} \dfrac{\alpha_j \cosh \alpha_j \sin \beta_j - \beta_j \sinh \alpha_j \cos \beta_j}{\alpha_j^2 + \beta_j^2} e^{-\frac{\gamma^2}{2(\kappa_j+1)}(\|q_i\|^2 + \kappa_j(\mu_j' q_i)^2)}, & q_i \notin \Omega_{ij}, \end{cases}$$